United States Patent
Yalcin et al.

(10) Patent No.: US 6,457,159 B1
(45) Date of Patent: Sep. 24, 2002

(54) FUNCTIONAL TIMING ANALYSIS FOR CHARACTERIZATION OF VIRTUAL COMPONENT BLOCKS

(75) Inventors: Hakan Yalcin, San Jose, CA (US); Robert J. Palmero, Shoreview, MN (US); Karem A. Sakallah, Ann Arbor, MI (US); Mohammad S. Mortazavi, Santa Clara; Cyrus Bamji, Fremont, both of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/477,710

(22) Filed: Dec. 28, 1999

Related U.S. Application Data
(60) Provisional application No. 60/114,253, filed on Dec. 29, 1998.

(51) Int. Cl.[7] .............................................. G06F 17/50
(52) U.S. Cl. ................................................. 716/6; 716/4
(58) Field of Search ................................ 716/1, 2, 3, 4, 716/5, 6, 7, 8, 9, 10, 11, 18; 703/19, 14, 15, 16

(56) References Cited

U.S. PATENT DOCUMENTS

| | | | | |
|---|---|---|---|---|
| 5,404,311 A | * | 4/1995 | Isoda .............................. | 716/6 |
| 5,475,605 A | * | 12/1995 | Lin ................................. | 716/6 |
| 5,475,607 A | * | 12/1995 | Apte et al. ...................... | 716/6 |
| 5,572,717 A | * | 11/1996 | Pedersen ........................ | 716/6 |
| 5,764,531 A | * | 6/1998 | Kojima et al. .................. | 716/6 |
| 6,175,946 B1 | * | 1/2001 | Ly et al. ......................... | 716/4 |
| 6,253,361 B1 | * | 6/2001 | Buch ............................... | 716/6 |

OTHER PUBLICATIONS

D. Brand, V. Iyengar, "Timing Analysis Using Functional Analysis," *IEEE Transactions On Computers*, vol. 37, No. 10, Oct. 1988, pp. 1309–1314.

D. Brand, V. Iyengar, "Timing Analysis Using Functional Relationships," *Proc. Int'l. Conf. on Computer Aided Design*, 1986, pp. 126–129.

(List continued on next page.)

*Primary Examiner*—Matthew Smith
*Assistant Examiner*—Paul Dinh
(74) *Attorney, Agent, or Firm*—Lyon & Lyon LLP

(57) ABSTRACT

A system and method for performing a timing analysis on virtual component blocks or other circuit models is provided wherein functional information obtained from the circuit's control inputs and their useful combinations is used to improve accuracy. The control inputs and data inputs for a circuit block are identified. Each functionally meaningful or useful control input combination is applied to the circuit block, and the topological delay for the data inputs are determined only along the paths that are not blocked by the control inputs. The delays along paths that are blocked are ignored. The analysis is further augmented by determining the topological delay for all paths originating at control inputs, without regard to blocking of paths, so as to reduce the chance for possible underestimation of delays from the data inputs. A final timing model may include the combination of maximum delays along data paths for each combination of control inputs, and maximum delays along paths originating from each of the control inputs. The delay analysis may account for different input slews and load capacitances, and the results may be expressed in tabular or matrix form. A useful technique for condensing time delay information (whether scalar or tabular in form) is also provided, to simplify timing characterization of a virtual component block or circuit model. Delay tables or matrixes that are "close" (i.e., within a specified tolerance) may be combined into a single table or matrix.

12 Claims, 6 Drawing Sheets

OTHER PUBLICATIONS

V.H. Hrapcenko, "Depth and Delay in a Network," *Soviet Math Dokl.*, vol. 19, 1978, pp. 1006–1009.

H. Yalcin, J. Hayes, "Hierarchical Timing Analysis Using Conditional Delays," *Proc. Int'l. Conf. on Computer Aided Design* 1995, pp. 371–377.

H. Yalcin, J. Hayes, K. Sakallah, "An Approximate Timing Analysis For Datapath Circuits," *Proc. Int'l. conf. on Computer Aided Design*, 1996, pp. 114–118.

J.P.M. Silva, K. Sakallah, "Efficient and Robust Test Generation–Based Timing Analysis," *Proc. Int'l. Symp. on Circuits and Systems*, 1994.

T.M. McWilliams, "Verification of Timing Constraints on Large Digital Systems," *Proc. Design Automation Conf.*, 1980, pp. 139–147.

H.C. Chen and D.H.C. Du, "Path Sensitization in Critical Path Problem," *IEEE Trans. on CAD*, vol. 12, Feb. 1993, pp. 196–207.

Y. Kukimoto, W. Gosti, A. Saldanha, R.K. Brayton, "Approximate Timing Analysis of Combinational Circuits Under the XBD0 Model," *Proc. Int'l Conf. on Computer Aided Design*, 1997, pp. 176–181.

Y. Kukimoto, R.K. Brayton, "Hierarchical Functional Timing Analysis," *Proc. Design Automation Conf.*, 1998, pp. 580–585.

S.V. Venkatesh, R. Palmero, M. Mortazavi, K. Sakallah, "Timing Abstraction of Intellectual Property Blocks," *Proc. Custom Integrated Circuits Conf.*, 1997, pp. 99–102.

P.C. McGeer, R.K. Brayton, Integrating Functional and Temporal Deomains in Logic Design: The False Path Problem and its Implication, Kluwer Academic Publishers, Boston, 1991, pp. 29–95.

Gersho, Allen, et al., "Vector Quantization and Signal Compression," Kluwer Academic Publishers, 1992.

* cited by examiner

FUNCTIONAL TIMING ANALYSIS FOR CHARACTERIZATION OF VIRTUAL COMPONENT BLOCKS

CROSS-REFERENCE TO RELATED APPLICATIONS

This application is a continuing application of U.S. Provisional Application Serial No. 60/114,253 filed on Dec. 29, 1998, hereby incorporated by reference as if set forth fully herein.

FIELD OF THE INVENTION

The field of the present invention relates to electronic design automation and, more particularly, to methods and systems for timing analysis of electronic circuit blocks.

BACKGROUND OF THE INVENTION

Advances in silicon technology increasingly allow larger and more complex designs to be formed on a single chip. Designs may consist of millions or tens of millions of transistors on a single chip. At the same time, however, market demands continue to push designers to develop designs more rapidly and efficiently. A recent trend to increase design speed and efficiency involves the re-use or recycling of electronic circuit blocks or subsystems, commonly referred to as "cores" or "IPs" (for "Intellectual Properties"), hereinafter referred to for convenience as "virtual component blocks" or "VCs." Once the design for a virtual component block has been tested and verified, it can be re-used in other applications which may be completely distinct from the application which led to its original creation. For example, a subsystem for a cellular phone ASIC may contain a micro-controller as well as a digital signal processor and other components. After the design for the cellular phone subsystem has been tested and verified, it could be re-used (as a virtual component block) in, for example, an automotive application. Design reuse of virtual component blocks allows a designer to complete a design much faster than building the entire design from scratch, and avoids the need for debugging, testing and verification of the subsystems embodied in the virtual component block.

While virtual components have been found to be convenient for expediting and simplifying the circuit design process, the successful use of virtual component blocks hinges on the ability to accurately characterize their timing and functionality. A number of techniques have been developed or proposed for performing timing analyses on virtual component blocks, including static timing analysis and functional timing analysis.

Static timing analysis involves the calculation of a worst-case structural (or topological) delay between a circuit's input and outputs, but ignores the functionality of the circuit. Static timing analysis methods make no attempt to detect false paths, which are signal paths never sensitized (activated) in actual operation. The use of functional information to improve the accuracy of static timing analysis methods has been proposed in the past—for example, in P. McGeer et al, *Integrating Functional and Temporal Domains in Logic Design: The False Path Problem and Its Implications*, Kluwer Academic Publishers (Hingham, Mass. 1991).

Functional timing analysis methods attempt to rely on the fact that the delays in a circuit are linked to the way a circuit functions. "Functionality" in this context refers to the logical value computed for each circuit node, given an input vector. Unlike traditional static timing analysis, functional timing analysis uses a circuit's function as well as its structure to characterize delays and timing constraints.

Two widely used methods for functional timing analysis are symbolic analysis via binary-decision diagrams (BDDs), and Boolean search methodologies that systematically enumerate the input space. Both methods assume that the delays of a circuit depend on the values of all of its inputs. These methods aim at finding an input vector that sensitizes the true longest path. However, they both have the disadvantage that their complexity increases exponentially with circuit size, limiting their applicability, or requiring unacceptably large amounts of computation resources for larger circuit designs.

A more practical approach is to assume that a circuit's delays depend on only a subset of its inputs. This is typical of datapath circuits, where a small number of control inputs determine the delays between a large number of data inputs and data outputs. A simple example is shown by a circuit 50 in FIG. 1, wherein the control inputs 60 to a large extent determine the delays between the data inputs 55 and the data outputs 70.

Methods of timing analysis have been developed based upon the recognition that the control inputs play a role in determining the delays between the data inputs and outputs. These methods generally trade accuracy for computation efficiency. For example, some static timing analyzers employ a systematic case analysis capability whereby the user sets some inputs to constant values prior to performing the timing analysis. A drawback with such timing analysis methods is that they suffer from delay underestimation. Delay underestimation is a serious problem in circuit design because it can lead to incorrect operation.

One timing analysis model involves calculation of the delay in a so-called "floating mode" of operation. In a floating mode of operation, each circuit node initially has an unknown value. Upon the application of an input vector to the circuit, the circuit node undergoes a series of transitions or events before it eventually stabilizes at a value determined by the circuit's internal static functionality.

Examples of event propagation using principles of "controlling" and "non-controlling" values are illustrated in FIGS. 2A and 2B, for the simple case of a two-input AND gate. A controlling value (CV) at a gate input is one that determines the output of the gate regardless of the values of the other inputs. A non-controlling value (NCV) does not change the gate output by itself. For an AND gate, the controlling and non-controlling values are 0 and 1, respectively. The arrival time of a gate output is determined by the earliest input with a controlling value, if it exists; otherwise, the latest input with the non-controlling value determines the output arrival time. In FIG. 2A, input "a" is a controlling value because it will eventually become 0, whereas in FIG. 2B, neither input "a" nor "b" is a controlling value because both will stay at 1. Because, input "a" has a controlling value in FIG. 2A, the gate output arrival time "$T_z$" is determined only by the arrival time $T_a$ of input "a", plus the gate delay d. In FIG. 2B, however, because neither input "a" nor "b" has a controlling value, the output arrival time $T_z$ is given by the latest input arrival time (in this example, $T_b$) plus the gate delay d. Because the last arriving event at any node determines the delay up to that node, the terms "arrival time" and "delay" are used interchangeably herein.

For a generic gate having inputs "a" and "b" and output "z" in floating mode (FM), these concepts may be shown in the form of a truth table, $T_z^{FM}$, such as appearing in Table 1 below.

TABLE 1

| $v_a$ | $v_b$ | $T_z^{FM}$ |
|---|---|---|
| CV | CV | min $(T_a, T_b)$ + d |
| CV | NCV | $T_a$ + d |
| NCV | CV | $T_b$ + d |
| NCV | NCV | max $(T_a, T_b)$ + d |

It is possible to write a logical expression (or predicate) that describes whether an input event propagates from a gate input to the gate output; such expressions are sometimes referred to as "sensitization conditions." Referring back to FIGS. 2A and 2B, the sensitization condition for the path from input "b" to gate output "z" may be denoted $COND_{bz}$. In FIG. 2A, this path is "sensitized" so that $COND_{bz}$ is 1 (true). In FIG. 2B, this path is not "sensitized" so that $COND_{bz}$ is 0 (false). A number of sensitization conditions have been proposed. Two such sensitization conditions, referred to as "viability" and "floating-mode condition," have been used in calculating the floating-mode arrival time of Table 1. The values of $T_z^{FM}$ shown in Table 1 are the least pessimistic that can be achieved in "floating mode." Thus, for any conditional expression $T_z^x$ to be correct for delay calculation using the conventional "floating mode" conditional analysis, it must exceed the delay values expressed in Table 1 above; that is, it must satisfy the relationship:

$$T_z^x \geq T_z^{FM} \; \forall v_a, \forall v_b$$

Several other sensitization conditions have been proposed. "Static sensitization" is a commonly used sensitization condition which has arisen from test generation. Static sensitization is based on the premise that a path is "sensitized" only if all its side inputs (i.e., inputs of a gate that are not on the delay path) have non-controlling values. A computational advantage of this condition is that it depends only on the final (stable) values of the inputs and is independent of the input event times. However, a drawback of static sensitization techniques is that, if the two inputs of a gate are controlling, they incorrectly assume that the paths from both inputs are false.

In contrast to static sensitization, the simplest (but most pessimistic) path sensitization condition is that of topological analysis where events always propagate. Thus, for the two-input gate case, the output arrival time, which may be designated $T_z^{TOP}$, is always the maximum of the input event times plus the gate delay. Table 2 below summarizes and compares the arrival times for floating mode, static sensitization, and topological analysis.

TABLE 2

| $v_a$ | $v_b$ | $T_z^{FM}$ | $T_z^{ST}$ | $T_z^{TOP}$ |
|---|---|---|---|---|
| CV | CV | min $(T_a, T_b)$ + d | $-\infty$ | max $(T_a, T_b)$ + d |
| CV | NCV | $T_a$ + d | $T_a$ + d | max $(T_a, T_b)$ + d |
| NCV | CV | $T_b$ + d | $T_b$ + d | max $(T_a, T_b)$ + d |
| NCV | NCV | max $(T_a, T_b)$ + d | max $(T_a, T_b)$ + d | max $(T_a, T_b)$ + d |

In Table 2, the term "$-\infty$" indicates that no event propagates; hence, an effectively "infinite" delay. As may be observed from viewing Table 2, the output arrival time $T_z^{TOP}$ under a topological analysis where events always propagate is always greater than or equal to the output arrival time $T_z^{FM}$ using floating mode conditional analysis. Topological analysis is commonly used in static timing analysis tools. A big disadvantage is its failure to detect any false paths, leading to overly pessimistic results.

A need exists for a functional timing analysis of circuit blocks that has improved accuracy, yet is not computationally burdensome.

SUMMARY OF THE INVENTION

The invention provides in one aspect systems and methods for performing a timing analysis on virtual component blocks or other circuit models by using functional information obtained from the circuit's control inputs and their useful combinations. A useful technique for condensing time delay information (whether scalar or tabular in form) is also provided, to simplify timing characterization of a virtual component block or circuit model.

A circuit block may have a number of connected gates, a set of control inputs, a set of data inputs, and a set of outputs which are coupled to the control and data inputs along various paths through gates or other circuit elements. In one embodiment, a system and method are provided whereby control inputs and data inputs for a circuit block are identified, along with the functionally meaningful or useful combinations of control inputs. Each functionally meaningful or useful control input combination is applied to the circuit block, and the topological delay for the data inputs are determined only along the paths that are not blocked by the control inputs. The delays along paths that are blocked are ignored. By limiting timing delay analysis to the control input combinations that are functionally meaningful or useful, a timing model results that more accurately reflects true performance of the circuit, in contrast to timing delay analyses that do not account for circuit functionality. A preferred timing delay analysis is further augmented by determining the topological delay for all paths originating at control inputs, without regard to blocking of paths, so as to reduce the chance for possible underestimation of delays from the data inputs. A final timing model may include the combination of maximum delays along data paths for each combination of control inputs, and maximum delays along paths originating from each of the control inputs. The delay analysis may account for different input slews and load capacitances, and the results may be expressed in tabular or matrix form. The functional timing analysis described herein may be embodied in a software program effectuating the methodology of such a timing analysis.

In a separate and distinct aspect of the invention, timing delay information may be condensed or reduced to simplify the timing characterization of a circuit block. Delays may be expressed, for example, in tables or matrixes having entries corresponding to specified input slew and load capacitance combinations. Tables or matrixes that are "close" (i.e., within a specified tolerance) may be combined into a single table or matrix. Table merging results in a smaller number of tables based upon the original set of delay tables, thereby ensuring that the reduced model accurately represents the circuit timing delays (within the specified tolerance). Table reduction according to the techniques described herein may be applied to any set of tables (preferably having the same dimensions), and is not limited to tables defining timing models, but may be applicable to other types of tables as well.

Further embodiments, variations, modifications and enhancements are also described herein.

DETAILED DESCRIPTION

In one or more embodiments as disclosed herein, a system and method are provided for performing a timing analysis on virtual component blocks by using functional information obtained from the circuit's control inputs and their useful combinations. A preferred technique for performing timing analysis is illustrated by a process flow diagram 600 in FIG. 6, and may be explained with reference to the various other figures from time to time.

Figure 1:
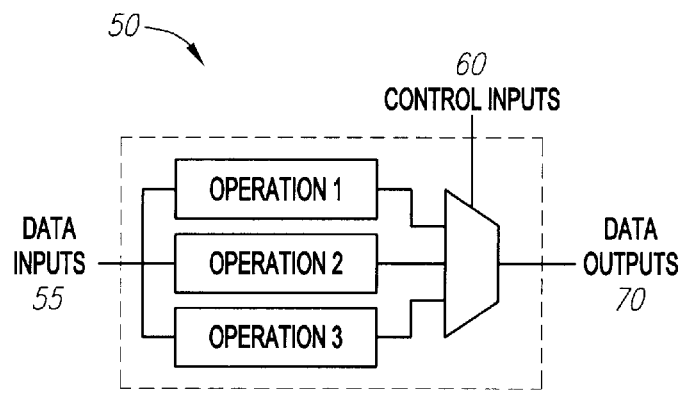
FIG. 1 is a block diagram of a simple circuit illustrating control inputs and data inputs.
Figure 2A:
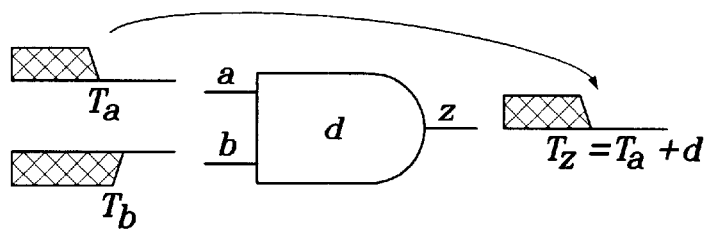
FIGS. 2A and 2B are diagrams helpful in illustrating delay calculations with respect to a simple two-input gate.
Figure 2B:
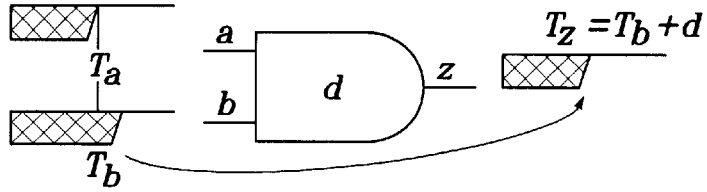
Figure 6:
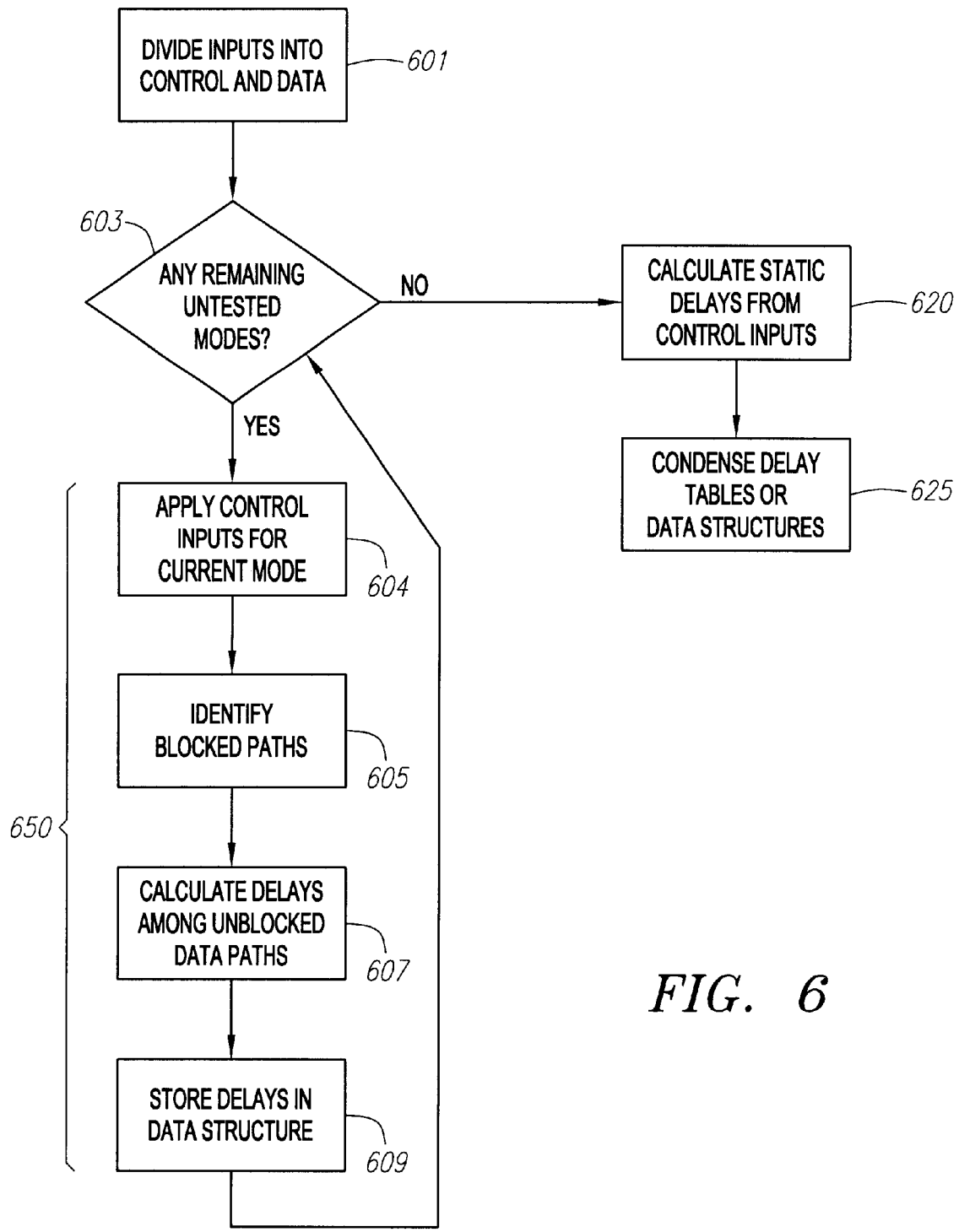
FIG. 6 is a process flow diagram in accordance with one embodiment of a system or method for performing a timing analysis on virtual component blocks by using functional information obtained from the circuit's control inputs and their useful combinations.

According to the embodiment illustrated in FIG. 6, as a first step 601 in the timing analysis flow diagram 600 depicted therein, the set of inputs for a given virtual component block is divided by the circuit designer into data inputs and control inputs. The division of circuit inputs into data inputs and control inputs is a task commonly performed by circuit designers, and is considered well within the purview of those skilled in the art. An example of a simple circuit showing control inputs 70 and data inputs 55 is illustrated in FIG. 1 and discussed briefly in the Background section hereof. In addition to dividing the set of inputs into data inputs and control inputs, the circuit designer also provides the meaningful combinations of control inputs. It is often the case that various combinations of control inputs are not utilized in the operation of a circuit, and this information can be useful in eliminating delay calculations that, due to the functionality of the circuit, will never occur in normal operation. Each functionally meaningful combination of control inputs is referred to herein as a "mode" of operation.

The next steps of the timing analysis flow diagram 600 may conveniently be represented as a logical loop 650, wherein each mode (i.e., each meaningful combination of control inputs) is evaluated for delay purposes. Thus, in a next step 603 within loop 650 of the timing analysis flow diagram 600, a determination of whether any further untested modes exist is made. If no further untested modes exist, then the process continues with step 620. Otherwise, in a next step 604 within loop 650, the next untested mode is applied; that is, the combination of control inputs corresponding to the untested mode is propagated from the control input entry points as far as possible within the circuit. As a result, certain data paths will become "blocked." As used herein, a data path is "blocked" when a controlling value has propagated to a gate's side inputs (i.e., inputs not on the data path). For example, if one input of an AND gate is 0, the paths from its other inputs will be blocked. Therefore, any data paths which pass through the inputs of that AND gate will be blocked. In step 605 within loop 650, the blocked data paths are identified. As opposed to being a separate step, step 605 may effectively be performed as part of step 607, described below, wherein false paths are identified when, in walking a given path, a blocked node is encountered. In other words, blocked paths need not be identified a priori, or as a separate step apart from step 607.

In step 607 within loop 650, the path delays between each data input and each output of the circuit are calculated by performing a topological analysis only on the unblocked paths of the circuit. Starting from each data input, a path is traversed to the data output, and the gate delays are added up along the path. If the path reaches a gate that is blocked by a controlling input, then the path is not carried forward. Rather, the process backtracks from the blocked gate, and another gate is tried. If all of the paths at the current level are blocked, then the process backtracks to the previous branching point and tries moving forward down another path. This process continues until each possible path is characterized with a calculated path delay from the given data input to the data output.

A path delay calculated for a particular mode (i.e., a particular combination of control inputs) is only "valid" for that mode. In a next step 609 within loop 650, the calculated path delays are stored in an appropriate data structure (e.g., a variable location, table or matrix, depending upon whether multiple input slews and/or output load capacitances are used in the analysis). The process then returns to step 603 to determine whether any further untested modes exist and, if so, analyzes them in the same manner.

When all of the data inputs have been analyzed for each mode, and all of the modes have been exhausted, the process continues with step 620, wherein the delays from the control inputs to the output are calculated using a static timing analysis. When the delays of all data inputs for all the modes have been processed through loop 650 and the delays for all control inputs have been analyzed in step 620, the result is a data structure or set of data structures containing as entries delay values for each input/output path, for only those combinations of control inputs that are meaningful. In a next step 625, the delay times may optionally be condensed into a compacted data structure to more conveniently characterize the functional timing of the circuit.

Figure 3:
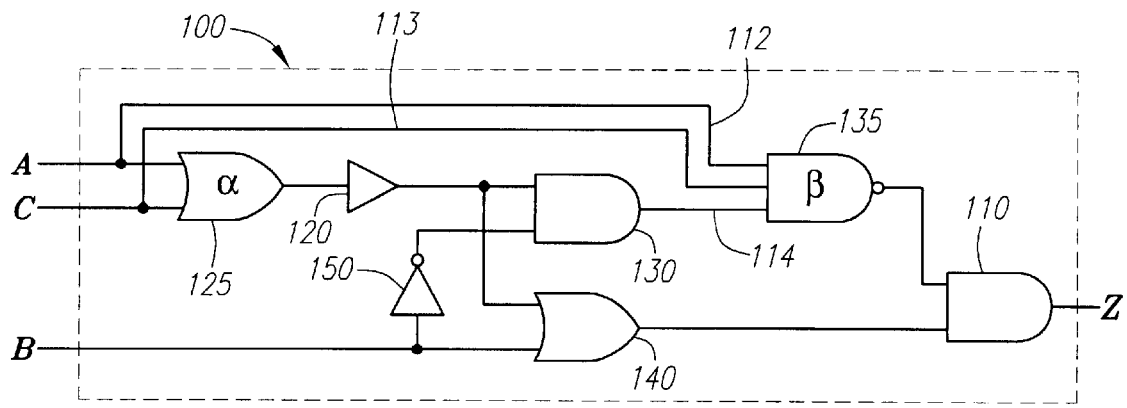
FIG. 3 is a diagram of a circuit helpful in illustrating a timing analysis according to one embodiment of the invention as disclosed herein.

Further details regarding the process set forth in the embodiment of FIG. 6 will now be provided. In particular, the process of propagating control inputs and evaluating the delays for unblocked paths may be illustrated with respect to an exemplary circuit 100 depicted in FIG. 3 (although in practice much more complicated circuits can be analyzed using the same principles). In the example shown in FIG. 3, input C is specified (by the designer) as a control input, whereas inputs A and B are specified as data inputs. For simplicity of illustrating the principle involved, each logic gate 110, 120, 125, 130, 135, 140 and 150 is assumed to possess a single "unit" delay, although in practice the actual delay of each logic gate would be utilized. In characterizing the delay in this example, only the maximum delay within a path is of interest.

As reflected by step 604 (see FIG. 6) in the timing analysis flow chart 600, each combination of control inputs is applied to the circuit 100 and propagated as far as possible. In this example, there are two modes: input C=0, and input C=1. Each mode is evaluated separately. In circuit 100, input C is connected to inputs of an OR gate 125 and a NAND gate 135. Considering the first mode wherein input C=0, input C does not represent a controlling value for the OR gate 125 because, a 0 applied to the input of an OR gate does not by itself determine the gate's output. As a result, the data path for A through OR gate 125 is not blocked by input C. However, no further propagation of the input C=0 value is possible at the OR gate 125 for the purposes of determining blocked paths, because the output of OR gate 125 will depend upon the value of input A. In other words, based on static analysis wherein input C=0,the output of OR gate 125 cannot be conclusively determined because it depends on other values (i.e., input A). When input C=0, it is, however, a controlling value with respect to NAND gate 135. Thus, it can be conclusively determined using static analysis in the input C=0 mode that an output of 1 will be generated from NAND gate 135. The output of 1 from NAND gate 135 will propagate to the input of AND gate 110. Because an input of 1 is not a controlling value for an AND gate, the signal cannot be propagated further, and the output of AND gate 110 is inconclusive. However, it is also true that in the mode of control input C=0, the AND gate 110 is not blocked by the output of NAND gate 135.

Thus, in this example, in the mode of input C=0, there is only a single blocked gate (NAND gate 135), and thus the only blocked paths are those leading into the NAND gate 135 (i.e., signal lines 112 and 114). Since the NAND gate 135 is blocked, there is only one possible path from input A to the output Z: the path through OR gate 125, buffer 120, OR gate 140, and AND gate 110. Having assigned unit delay values to each logic gate for simplicity, this path would have a delay of 4. Similarly, there is only one possible path from input B to the output Z: the path through OR gate 140 and the AND gate 110. Using unit delay values for each logic gate, this path has a delay of 2.

Having analyzed the effect of the first mode, wherein input C=0, the next mode, wherein input C=1, may be analyzed. The control input value of C=1 is not a controlling value for NAND gate 135, because it does not conclusively determine the output of the NAND gate 135. The control input value of C=1 is, however, a controlling value for the OR gate 125. The resulting output of 1 from the OR gate 125 may be propagated through the buffer 120 and to the input of OR gate 140 and to the input of AND gate 130. The signal will not propagate through the AND gate 130 because 1 is not a controlling value for this type of gate (i.e., an AND gate). However, 1 is a controlling value for an OR gate, and so OR gate 140 will be blocked. The resulting output of 1 from OR gate 140 can be propagated to the AND gate 110, but will be propagated no further because a 1 is not a controlling value for AND gate 110.

Having determined the blocked paths with control input C=1, the delays from the data inputs A and B to output Z are calculated. From data input A, there is only one possible path to the output Z: the path through NAND gate 135 and the AND gate 110. With a unit delay value for each logic gate, this path has a delay of 2. From data input B, there is also only one possible path to the output Z: the path through inverter 150, AND gate 130, NAND gate 135, and AND gate 110. With a unit delay value for each logic gate, this path has a delay of 4.

These results may be expressed using a particular notation in the form of "(COND, d)", which is used to denote that a path of delay "d" ending at node "u" is valid only when the condition COND is true. In one aspect, COND represents the sensitization condition for all paths of delay "d" terminating at "u". As additional helpful notation, the operator "!" may represent the inverse or falseness (in a Boolean sense) of a signal (i.e., "!C" would represent 0 or FALSE). As an example, the expression {(!C, 5), (C, 7)} means that the delay of this particular path is 5 when C=0 and is 7 when C=1. Unconditional delays are a special case and are denoted by the operator "−" such as in the expression: (−, d).

Using the (COND, d) notation described above, the path delays in circuit 100 can be expressed as:

$$A{=}{>}Z: \{(C,2), (!C,4)\}$$

$$B{=}{>}Z: \{(C,4), (!C,2)\}$$

The maximum delay from the above analysis is 4. This result may be compared with the result that would be achieved with purely static analysis. Using purely static analysis, a path of length 5 would exist from input A to output Z through OR gate 125, buffer 120, AND gate 130, NAND gate 135 and AND gate 110. As one consequence of the above analysis using the general principles laid out in the timing analysis flow diagram 600 (of FIG. 6), the path of length 5 from input A to output Z is determined to be a "false path" since it is blocked either at the OR gate 125 when C=1 or the NAND gate 135 when C=0. Thus, the maximum delay, at least through the data paths, is in reality only 4 (not 5), a result that is properly calculated according to the methodology described with respect to FIG. 6 but overestimated using purely static analysis.

However, the calculation of delays over the data paths does not end the timing analysis. According to the methodology expressed in the flow diagram 600 of FIG. 6, the delays from the control inputs is also preferably determined. In contrast, pure static sensitization methods assume that the control signals have had ample time to propagate and block any gate for which they are a controlling input. In reality, however, the data signals and control signals propagate simultaneously. Hence, it is possible for the control signals to arrive late at a controlling side input of a gate, blocking the gate only after the data signals have first been propagated through. Looking at the delay of the control input C in reaching the gates that it blocks, the maximum delay between input A and output Z in circuit 100 is 5: the path through OR gate 125, buffer 120, AND gate 130, NAND gate 135, and AND gate 110. The technique depicted in the flow diagram 600 of FIG. 6 accounts for the potential underestimation of delays from data input by calculating topological delays for paths originating at control inputs, i.e., no control input combination is applied. This step ensures that the outputs will always be assigned the correct delays, regardless of whether the delay of any data input is underestimated. For the circuit 100, the delay for path C=>Z may be expressed as:

$$C{=}{>}Z: (-,5)$$

Because the output delay for the circuit 100 is determined by the maximum delay of all paths, the methodology of the technique represented by flow diagram 600 of FIG. 6 will correctly calculate circuit delay to be 5.

The methodology expressed in the flow diagram 600 of FIG. 6 may be summarized in general terms by the following algorithm, where C denotes the control inputs, D denotes the data inputs, O denotes the outputs, and CS is a given set of control input combinations (i.e., modes):

For every combination $CS_i \in CS$,
1) apply $CS_i$ to the circuit
2) propagate the resulting control signals as far as possible
3) determine the subset i of paths from D=>O that are not blocked by the propagated control signals
4) calculate the topological delays on the subset i of paths from D=>O (note that this step may be combined with step (3) above)
5) calculate the topological delays from C=>O As described thus far, it has been assumed that each path is characterized with a single delay unit. In reality, the delay of a gate depends in part upon (i) the slope of its input transitions (input slew), and (ii) the capacitive loading at its output. This dependence may be represented, as is commonly done in the field of electronics, by a delay table (or matrix) where each entry corresponds to a particular input slew and a particular output capacitive load value. Often, a gate or other electronic component or circuit is characterized for delay purposes using two input slew values (one "fast" and one "slow") and two capacitive loads (one "large" and one "small"), and the delay of the gate, component or circuit within the particular system topology may be determined by extrapolating the values at those four "test" points according to the actual input slew and capacitive load. As an example of building such a delay table or matrix, two input slews may be selected as 0.1 nanoseconds ("fast") and 1 nanosecond ("slow"), and two load capacitances may be selected as 0.01 pF ("small") and 0.1 pF ("large") for purposes of timing characterization of an arbitrary path P. When applied to a gate, circuit or component, these values may result, for example, in a table or matrix such as delay table T appearing below (with any applicable time units, such as nanoseconds):

$$T = \begin{bmatrix} 8 & 9 \\ 10 & 11 \end{bmatrix}$$

where the first row and second row of the delay table T correspond to the input slews of 0.1 ns and 1 ns, respectively, and the first column and second column correspond to output load capacitances of 0.01 pf and 0.1 pf, respectively. Thus, for example, the delay of path P would be read as 8 ns from delay table T when the input to path P has a slew of 0.1 ns and the output of P has a load of 0.01 pF. The other entries correspond similarly to the other combinations of input slew and output load.

Within the context of the process described with respect to flow diagram 600 of FIG. 6, these types of delay tables may replace the scalar values previously described with respect to the conditional delay notation. As an example in which two condition inputs (C1 and C2) are used to form two different modes (i.e., input combinations of C1=C2=1 and C1=0, C2=1), the resulting delay calculations for a path from input I to output O may be expressed in a format such as:

I=>O: {(C1&&C2, T1),(!C1&&C2, T2)} where T1 and T2 are delay tables, and the operator "&&" denotes a logical AND operation.

The methodology reflected by the time delay analysis flow diagram 600 of FIG. 6 is amenable to being embodied as an automated process, wherein a computer or processor is instructed through programming code to carry out processing steps in accordance with the flow diagram 600 of FIG. 6. The degree of automation is flexible, and depends upon the needs and desires of the user, as well as the software tools available. In an automated process, the circuit design to be analyzed may comprise a virtual circuit block having any standard or non-standard format, so long as the design specification contains enough information to calculate timing delays. The circuit design may, for example, be in a "netlist" format, with the gates referred to in the netlist being pre-characterized to the extent necessary to perform a timing analysis. Information about timing (i.e., propagation) delays across the gates in the netlist may be stored in a timing library format (TLF) expression or any other suitable standard or non-standard format.

A TLF expression contains a representation of the timing parameters of a cell or gate. It preferably contains path delay and slew information, timing checks and input/output port capacitances. In a TLF expression, the delay of a path and its output slew is specified using a PATH statement. For example, a timing specification for a path with a fixed delay of 5 nanoseconds and a fixed slew of 0.1 nanosecond is:

PATH (I=>O01 10

Delay((const(5)))Slew((const(0.1))))
In the above statement, "01" and "10" refer to the input and output transition, respectively. Delays and slews can be defined for each combination of input and output transitions.

In a TLF expression, a condition may be added to a PATH statement using a keyword Cond. For the above example, if the path is true when C=1, corresponding to a conditional delay of (C, 5), the path specification may be expressed as follows:

PATH (I=>O Cond(C) 01 10

Delay((const(5))) Slew((const(0.1))))
In the above examples, it is assumed that the path is characterized with a single delay. If considering multiple input slews and load capacitances, then a table may be used to characterize the path delay, using a TLF model. For example, a TLF model may be generated for a path analyzed using two input slews of 0.1 ns and 0.2 ns and two load capacitances of 0.01 pF and 0.05 pF. In the TLF expression immediately below, the first delay table is valid for a condition of C1&&C2 (i.e., the logical AND of C1 and C2), and the second delay table is valid for !C1&&C2.

Cell (MyCell
Celltype (Comb)
Model (ioDelMax0 (Spline
(Input_Slew_Axis 0.1 0.2)
(Load_Axis 0.01 0.05)
((8.38 8.74)
(8.40 8.77))))
Model (ioDelMax1 (Spline
(Input_Slew_Axis 0.1 0.2)
(Load_Axis 0.01 0.05)
((8.41 8.68)
(8.43 8.84))))
PATH(I=>O Cond(C1&&C2) 01 10
DELAY(ioDelMax0) SLEW(ioSlewMax0))
PATH(I=>O Cond(!C1&&C2) 01 10
DELAY(ioDelMax1) SLEW(ioSlewMax1))
However the circuit to be analyzed and its timing parameters are characterized, to perform the analysis reflected in the flow diagram 600 of FIG. 6, the user preferably specifies which inputs are control inputs and which are data inputs. This information may be presented to the automated timing analysis process in the form of a file identifying such. Further, the user preferably provides an indication of which control input settings are meaningful, which information may too be put into a file format.

The automated timing analysis process may then utilize the virtual circuit block data, its associated timing data, and the user-specified information concerning data inputs, control inputs, and control input combinations, to carry out the timing analysis set forth in the flow diagram 600 of FIG. 6. The automated timing analysis process may be programmed to select each control input setting sequentially, until all meaningful control input settings are exhausted. The automated timing analysis process may apply the control inputs to the circuit model and use a logic simulator, or its equivalent, to walk the various paths in order to determine which paths are blocked. Generally, each gate or cell of the circuit model has an associated truth table which allows a logic simulator or equivalent software tool to determine whether an input will propagate through a gate or cell and yield a definitive output, or whether the output of the gate or cell will be indeterminate based upon its inputs. Logic simulators are conventionally known and are a widely used circuit analysis tool. Using a logic simulator or a similar software tool, the automated timing analysis process can determine whether each node of the circuit model is a 0, 1 or undetermined, as specified by step 605 of FIG. 6. This information can be temporarily stored in a netlist or similar structure.

Next, the automated timing analysis process may calculate delays along all unblocked data paths for each input/output combination, as specified in step 607 of FIG. 6. An input/output path is followed through to completion only if each gate or cell it passes through has an unspecified or undetermined output (i.e., it is not blocked). If the output is already fixed at a 0 or 1 when the gate or cell is reached, then the automated process backtracks from that gate and tries the next available path. The cumulative delays are added up along the path to arrive at a final delay value (or set of delay values in tabular form). These delay values, regardless of how represented, are stored by the computer, as specified in step 609 of FIG. 6.

Once the delays are calculated for all of the input/output paths for each meaningful control input combination, the delays are calculated from each control input to each output, using any standard or available static timing analysis software tool, as specified by step 620 of FIG. 6. The information is also stored by the computer. The automated timing analysis process may then condense or merge the timing delay information, as specified by step 625 of FIG. 6, according to any of the techniques described elsewhere herein.

Figure 7:
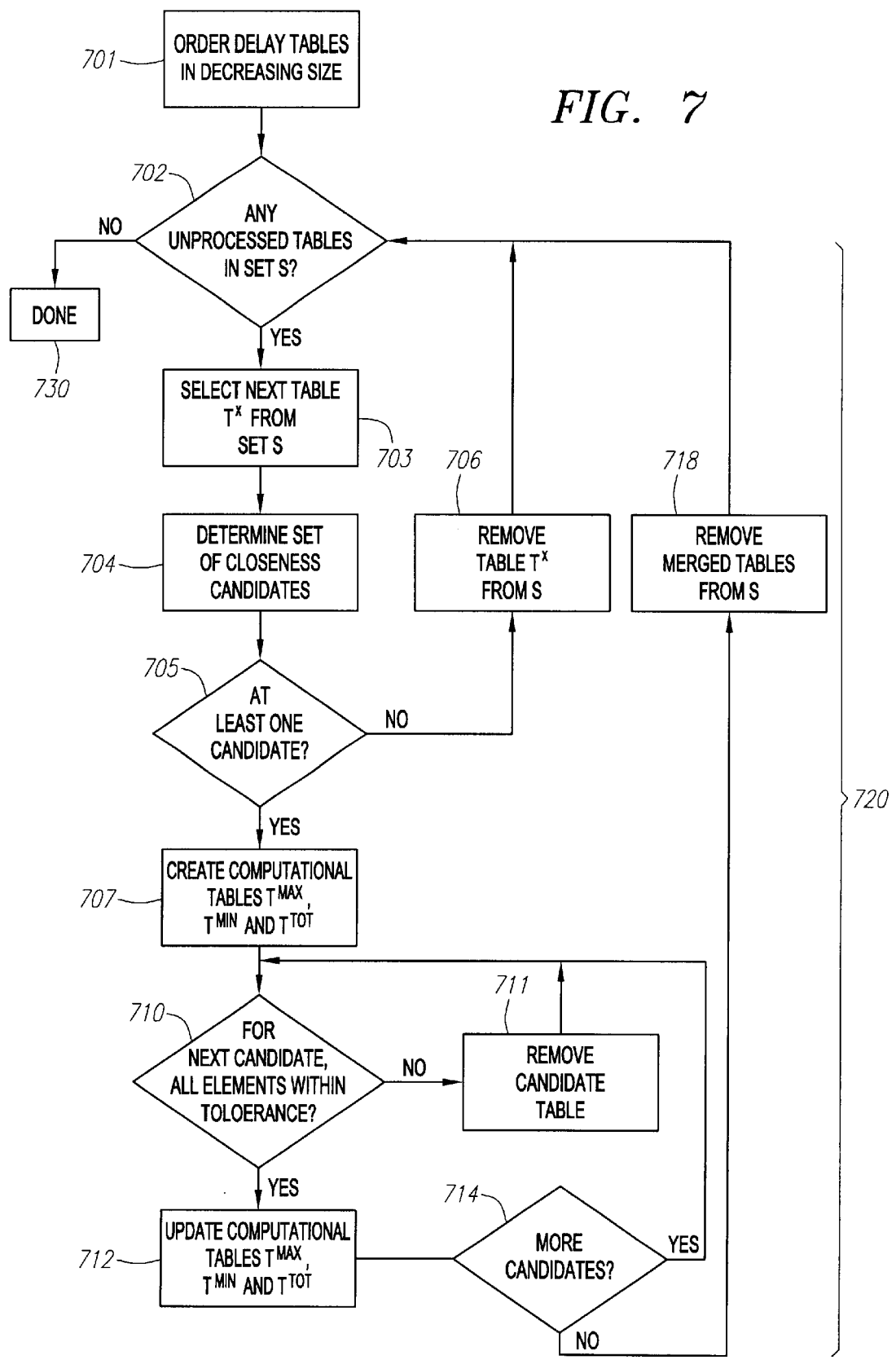
FIG. 7 is a process flow diagram in accordance with one embodiment of a system or method for reducing the number of delay tables through a merging tables having similar delays.

Regardless of whether scalars or tables are used, the resulting number of delay tables can grow very large if the circuit being analyzed has many modes of operation. A preferred embodiment includes a model reduction technique to make the timing characterization of the virtual circuit block more compact and to speed up timing analysis in certain situations where it is deemed advantageous to do so. In such a model reduction technique (preferred steps of which are illustrated in FIG. 7, explained in more detail hereinafter), scalar (or table) delays falling within a given tolerance are merged into a single scalar (or table) delay. Accuracy loss due to the merging of table delays is generally equal to the specified tolerance, which may be provided by a user, or else pre-specified (as a percentage or absolute amount), or automatically generated based upon the general magnitudes and/or ranges of the delays.

Consider, as a simple example, the following statement of conditional delays for a path from I to O for four different modes (represented as conditions C0 through C3):

$$I\!=\!\!>\!O: \{(C0, 1.2), (C1, 1.3), (C2, 1.9), (C3, 2.0)\}$$

In this example, the delays are 1.2, 1.3, 1.9 and 2.0 time units (e.g., nanoseconds), respectively, for the modes C0 through C3. Suppose that the user-specified tolerance is, for example, 0.1 time units (e.g., nanoseconds). The first two conditions and their associated delays can then be "merged" because the delays fall within 0.1 time units of one another. However, the middle two delays (1.3 and 1.9) cannot be merged, because they are 0.6 time units apart. When merging the first two delays into a single delay expression, the longest delay is chosen, so the path for the shorter of the two delays (in this case, C0) is effectively increased to 1.3 from 1.2. Similarly, the last two delays may also be merged together so as to be represented by a single conditional delay expression because the two delay values (1.9 and 2.0) fall within the specified tolerance of 0.1 time units, effectively increasing the stated path delay for C2 to 2.0. The merged delay chart may be expressed as:

$$I\!=\!\!>\!O: \{(C0\|C1, 1.3), (C2\|C3, 2.0)\}$$

wherein the operator "$\|$" represents a logical OR operation. In other words, for mode (i.e., condition) C0 or C1, the stated delay is 1.3 time units; and for mode C2 or C3, the stated delay is 2.0 time units. Using this technique, the manner of expressing delays for the circuit model can be simplified, at the expense of losing a small amount of accuracy dependent upon the user-specified tolerance. In this example, if the tolerance were increased to 0.8 time units, then all four conditionals (C0 through C3) and their associated delays could be merged into a single conditional delay statement, at the expense of a somewhat larger degree of reduced accuracy.

In the case of delay tables, model reduction becomes more involved because of the added complexity of relating matrices to one another. Consider, for example, p tables (which may be designated $T^1, T^2, \ldots T^p$), each representing the table delay for a specific mode of operation based on the control input settings. Without loss of generality, each table may be assumed to be of size m×n, where m is the number of different input slews and n is the number of different load capacitances. Associated with each table is a condition which specifies the control input combinations for which the table is valid. In a preferred embodiment, the tables are merged based on a "closeness" with respect to a user specified tolerance delay, denoted "TOL" herein, such that if two tables $T^k$ and $T^l$ are merged, it is guaranteed for all i and j that:

$$|t_{ij}^k - t_{ij}^l| \leq TOL$$

wherein $t_{ij}$ is the element of delay table T in row i and column j.

The following definition is useful for comparing tables according to one or more of the preferred techniques disclosed herein:

$$sum(T^k) = \sum_{i=1}^{m} \sum_{j=1}^{n} |t_{ij}^k|$$

That is, the expression "sum($T^k$)" represents the aggregate sum of all of the delay values contained in the delay table $T^k$.

A preferred method for delay table reduction may be explained with reference to FIG. 7. As illustrated in FIG. 7, the steps of the preferred method 700 of merging delay tables are as follows:

1. In a first step 701, the delay tables are ordered in decreasing size of the aggregate sum of all of the delays therein (i.e., sum($T^k$)), resulting in an ordered list of delay tables S=($T^1, T^2, \ldots T^p$).
2. A delay table processing loop 720 is then executed. In a first step 702 of the delay table processing loop 720, a check is made to see if there are any more delay tables. Assuming that there are, the next unprocessed delay table is selected in step 703.
3. In a next step 704 of the delay table processing loop 720, a set of "closeness candidates" is determined. Assuming the first pass through delay table processing loop 720, the method 700 starts with the first element (i.e., delay table) $T^1$ of the ordered list of delay tables S and determines all closeness candidates of delay table $T^1$ by finding all delay tables $T^k$ which are capable of being merged with delay table $T^1$. In a preferred embodiment, the closeness candidates are determined by finding all delay tables $T_k$ such that:

$sum(T^1)-sum(T^k) \leq m \cdot n \cdot TOL$ wherein, as noted, each table is of a size m×n. For convenience, let Q be used to represent the resulting set containing all delay tables meeting the above criterion, and let q be the size of Q, where q is less than or equal to p. More generally, for any given iteration of the delay table processing loop 720, a set of all closeness candidates Q is derived for the current delay table $T^x$ by finding all remaining delay tables $T^k$ such that:

$sum(T^x)-sum(T^k) \leq m \cdot n \cdot TOL$

Step 704, in one aspect, effectively operates as a pre-screening step so as to limit the candidates evaluated and processed in subsequent, more computationally-expensive steps.
4. In a next step 705, a determination is made to see if q is greater than 1. If q is equal to one, then there are no closeness candidates, and the process 700 eliminates the current delay table $T^x$ and returns to the top of the delay table processing loop 720.

a) Otherwise (i.e., q is greater than 1), step 707 is carried out, wherein two new delay tables $T^{max}=T^x$, $T^{min}=T^x$ are created for the current delay table $T^x$ for computational purposes, plus an additional "tolerance table" $T^{TOL}$ is created having the specified tolerance value TOL in each of its entries, i.e., $t_{ij}^{TOL}=TOL$ for all i and j.

b) In a next step 710, each delay table $T^k$ in Q is cycled through and processed to determine whether it belongs in the actual closeness set of the current delay table $T^x$. Thus, each delay table $T^k$ in the set of closeness candidates Q is included in the closeness set of the current delay table $T^x$ if each of the elements of the delay table $T^k$ meet the following test:

$t_{ij}^{min}-t_{ij}^{TOL} \leq t_{ij}^k \leq t_{ij}^{max}+t_{ij}^{TOL}$, for all i and j In other words, each element of the candidate delay table $T^k$ must be greater than or equal to the corresponding element, less the tolerance amount, of the minimum delay table $T^{min}$ generated from the current table $T_x$, but less than or equal to the corresponding element, plus the tolerance amount, of the maximum delay table $T^{max}$ generated from the current table $T^x$, in order to be included in the closeness set of the current delay table $T^x$. As an alternative way of expressing this test, assume that the elements of delay tables $T^x$ and $T^k$ may be represented as follows:

$$T^x = \begin{bmatrix} d1 & d2 \\ d3 & d4 \end{bmatrix} \quad T^k = \begin{bmatrix} d5 & d6 \\ d7 & d8 \end{bmatrix}$$

Then, in order to pass the test to be included in the closeness set of the current delay table $T^x$, the elements of the candidate delay table $T^k$ must meet the following criteria:

$|d1-d5|<TOL_{11}$ $|d2-d6|<TOL_{12}$ $|d3-d7|<TOL_{21}$ $|d4-d8|<TOL_{22}$ wherein $TOL_{ij}$ corresponds to the tolerance value at location i,j in the matrix of tolerance values. If the candidate delay table $T^k$ does not pass the above test in step 710, then, in a next step 711, it is removed from the set of closeness candidates Q. Otherwise, in step 712, the computational tables $T^{max}$, $T^{min}$, and $T^{TOL}$ are updated as follows:

$t_{ij}^{max}=max(t_{ij}^{max},t_{ij}^k)$ $t_{ij}^{min}=min(t_{ij}^{min},t_{ij}^k)$ $t_{ij}^{TOL}-(t_{ij}^{max}-t_{ij}^{min})$ Effectively, each element in the maximum delay table $T^{max}$ is increased to the delay value of the corresponding element in the candidate delay table $T^k$ unless the element in the maximum delay table $T^{max}$ is larger; each element in the minimum delay table $T^{min}$ is decreased to the delay value of the corresponding element in the candidate delay table $T^k$ unless the element in the minimum delay table $T^{min}$ is smaller; and each tolerance value (i.e., each element) in the table of tolerances $T^{TOL}$ is reduced by the differential between the new delay value for the corresponding element in the maximum delay table $T^{min}$ and the new delay value for the corresponding element in the minimum delay table $T^{min}$, so that subsequent candidate delay tables will still be within the original tolerance values specified for the current delay table $T^x$ is being processed. In one aspect, the updates to computational tables $T^{max}$, $T^{min}$, and $T^{TOL}$ keep track of the leeway remaining within the original specified tolerance at the start of the merge process.

c) When all possible delay tables in the set Q of closeness candidates have been processed, a "new" merged delay table results. The merged delay table representing Q constitutes either the maximum delay table $T^{max}$ (if maximum delay values are of interest for "worst case" timing analysis), or the minimum delay table $T^{min}$ (if minimum delay values are of interest for "best case"

timing analysis). The "condition" for $T^{max}$ (or $T^{min}$) is the logical OR of the conditions for the delay tables in Q—that is, the set of modes (control input value combinations) which originally yielded the delay tables from which the merged table was developed.

4. In a next step 718, the remaining delay tables in the set Q are removed from the ordered list of delay tables S, and the process 700 returns to step 702 and repeats the delay table processing loop 720 until no delay table is left in the ordered list of a delay tables S. At that point, the process 700 finishes at step 730.

When process 700 shown in FIG. 7 is complete, what is left is a reduced set S' of delay tables, some of which may be delay tables from the original ordered list S of delay tables which could not be merged with other delay tables, and some of which will generally be new tables generated from the "merger" of two or more delay tables from the original ordered set S of delay tables. The reduced set S' of delay tables may be used to characterize the behavior of the circuit model to which they pertain. Because S' is smaller than the original ordered list S of delay tables, the reduced set S' of delay tables is generally easier for designers to comprehend and manage. A reduction of delay tables from the original ordered list S to a reduced set S' is possible because the inventors have recognized that many data paths are highly similar and will therefore have very similar delay characteristics.

The process 700 set forth in FIG. 7 lends itself to being carried out in an automated manner. To this effect, the delay tables for a circuit model may be advantageously stored in a computer memory in a standard tabular format such as TLF. The preparation of programming code for causing a computer processor to order the delay tables, generate computational tables $T^{MIN}$, $T^{MAX}$ and $T^{TOL}$, and process the ordered set S of delay tables according to the methodology set forth in FIG. 7, is considered well within the purview of those skilled in the art of computer programming.

While the process 700 shown in FIG. 7 represents a preferred methodology for reducing the number of delay tables, other comparable approaches are possible utilizing the same or highly similar principles, and will be apparent to those skilled in the art. For example, the delay tables may be arranged in increasing order, rather than decreasing order, and processed accordingly. In some instances, the delay tables need not be ordered, although lack of initial ordering is likely to increase processing time. The step 704 of determining initial closeness candidates may be omitted, if desired. Alternatively, other pre-screening checks may be employed.

As an alternative to performing table or matrix compression, each delay table or matrix may be converted into a vector (e.g., a 2×2 table would be converted into a 4-element vector), and vector quantization used to merge neighboring vectors using similar principles as described above. Vector quantization is a widely used technique in certain other applications, such as image processing, wherein an attempt is made to obtain a representative value for a (maximum) number of vectors. In image processing, vector quantization is used to reduce image size by merging a number of neighboring points into one while attempting to maintain image quality. As applied to compression of delay values stored as vectors, vector quantization techniques would be modified so that the worst-case element (i.e., maximum delay value) is selected for each vector position in the "merged" vector. In addition to vector quantization, a wide variety of other alternative possibilities exist for delay table compression based upon the particular implementation desired.

Figure 4:
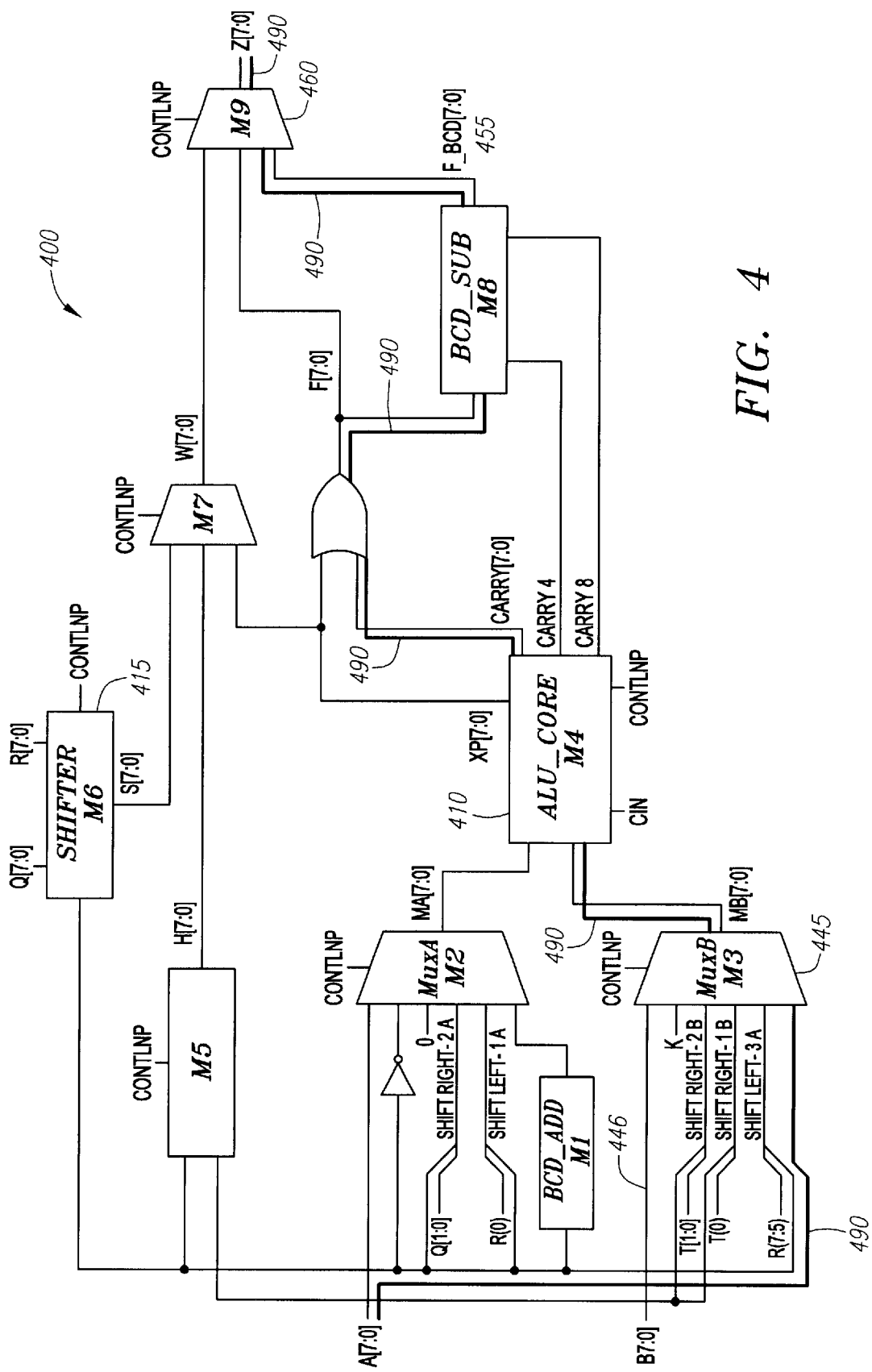
FIG. 4 is a circuit block diagram of an arithmetic logic unit which may be used as an example for illustrating certain aspects of the timing analyses described herein.

The effectiveness of the above-described systems and methods may be further illustrated by an example in which the timing analysis is applied to a conventional 8-bit arithmetic logic unit (ALU) known as the c3540, a benchmark from the widely-used ISCAS-85 benchmark suite. A high-level model is used to determine useful control input combinations (i.e., modes), which are used in this example to govern the timing analysis process as described previously with reference to FIG. 6. Turning now to FIG. 4, a high-level block diagram of the c3540 ALU 400 is illustrated. The largest block 410 of the ALU 400 is the ALU core 410 (denoted M4). The ALU core 410 performs 16 different arithmetic and 16 logical operations (similar to conventionally known TTL circuit 74181). In addition, the ALU core 410 includes a shifter 415 (denoted M6) and two small blocks 420, 422 (denoted BCD_add (M1) and BCD_sub (M8), respectively), which collectively allow the ALU 400 to perform BCD arithmetic. The ALU 400 has a total of 14 control inputs, denoted in various places by the ContInp bus. Each combination of the ContInp bus corresponds to a circuit operation, but not all the combinations are meaningful or useful.

As will be apparent, there is a large amount of variation in path delays among different modes (i.e., ALU operations). An analysis of the path between A[0] and Z[7] for two dozen operations was performed according to the methodology set forth in FIG. 6. Delay tables were calculated by the Virtuoso Core Characterizer™ tool, which is part of the Custom Core Authoring™ toolset commercially available from Cadence Design Systems, Inc., of San Jose, Calif. Two input slew values of 0.1 ns and 1 ns and two load capacitance values of 0.1 pF and 1.0 pF were chosen for this example, resulting in 2×2 delay tables.

Because some ALU operations yield identical delay tables, only nine of the delay tables turned out to be distinct. The following list illustrates, for each condition (i.e., mode), a representative operation for each of the nine delay tables:

| Control input combination | TLF Table | Condition | Representative Operation |
| --- | --- | --- | --- |
| #1 | T1 | C1 | F <- A XOR B |
| #2 | T2 | C2 | F <- Shift Right A |
| #3 | T3 | C3 | F <- A |
| #4 | T4 | C4 | F <- all 1's |
| #5 | T5 | C5 | F <- A + A |
| #6 | T6 | C6 | F <- B - A |
| #7 | T7 | C7 | F <- A + B |
| #8 | T8 | C8 | F <- A + B (BCD add) |
| #9 | T9 | C9 | F <- Sh1-A + ShL3-A |

For control input combination set #1, the delay table T1 does not contain any delays because no path exists between A(0) and Z(7). Such a situation occurs, for example, in the case for bitwise logical operations for ALU 400.

The tables with minimum and maximum delays are obtained with input sets #2 and #9, respectively, which are determined (according to the methodology set forth in FIG. 6) as:

$$T2 = \begin{bmatrix} 21.90 & 31.15 \\ 22.30 & 31.55 \end{bmatrix}, \quad T9 = \begin{bmatrix} 44.85 & 54.10 \\ 45.10 & 54.33 \end{bmatrix}$$

wherein the rows of each delay table represent delays for each input slew, and the columns represent delays for each output load.

On the other hand, without any control input applied, the following delay table is obtained (from static analysis of topological delays):

$$T^{TOP} = \begin{bmatrix} 48.10 & 57.30 \\ 48.30 & 57.55 \end{bmatrix}$$

For ease of comparing results, the average of the four delay values in each table was determined for this example. The average delays for all nine input combinations are shown by the nine columns in FIG. 5A. The delays calculated for delay table $T^{TOP}$ (i.e., based on static analysis of topological delays) are greater than any of the (average) delays calculated according to the method of FIG. 6, which indicate that those delays are based on one or more false paths. A static timing analysis performed on ALU 400 reveals that the highlighted path 490 in FIG. 4 as being the longest one between data input A(0) and output Z(7). This path 490, however, turns out to be false, for the following reason. When the F_BCD bus 455 goes through the final multiplexer 460 (designated M9) during a BCD operation, it turns out the first input multiplexer 445 (designated M3) always selects its first input, the B bus 446. The highlighted path 490 is impossible to activate due to control input dependencies. Thus, the topological delay analysis yields overly pessimistic results, in contrast to the methods and techniques described herein with respect to FIG. 6 and elsewhere.

Figure 5A:
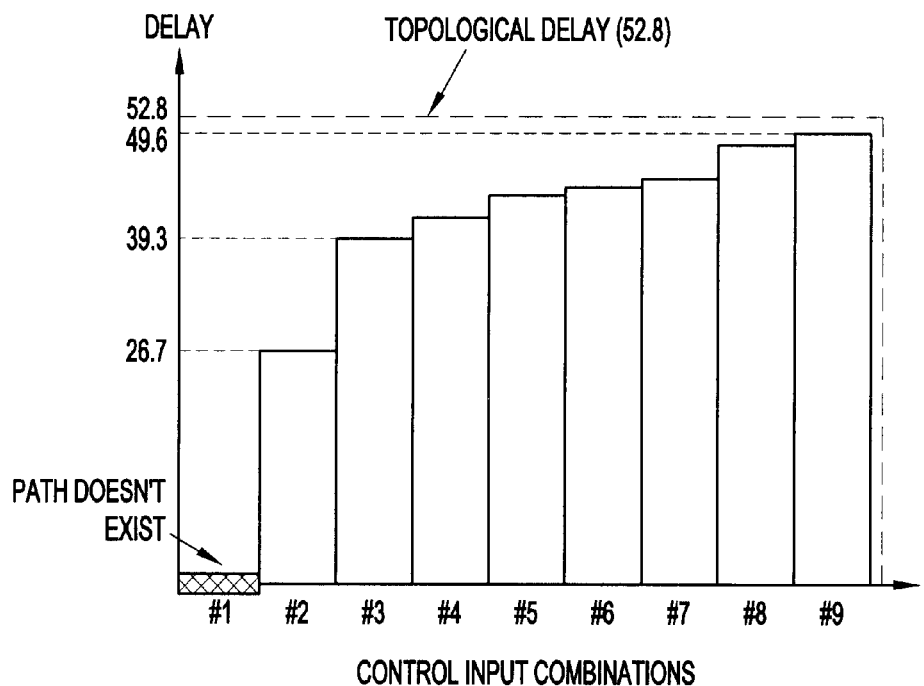
FIG. 5A is a bar graph of delays calculated for the circuit of FIG. 4.

As revealed by FIG. 5A, the shortest path delay (26.7 ns), associated with operation #2, is nearly half the magnitude of the longest path delay (49.6 ns), associated with operation #9. Other operations produce a delay time between those two extremes. The large variation in delay between circuit operations therefore may be advantageously captured by applying the methods and techniques described herein with respect to FIG. 6 and elsewhere.

Figure 5B:
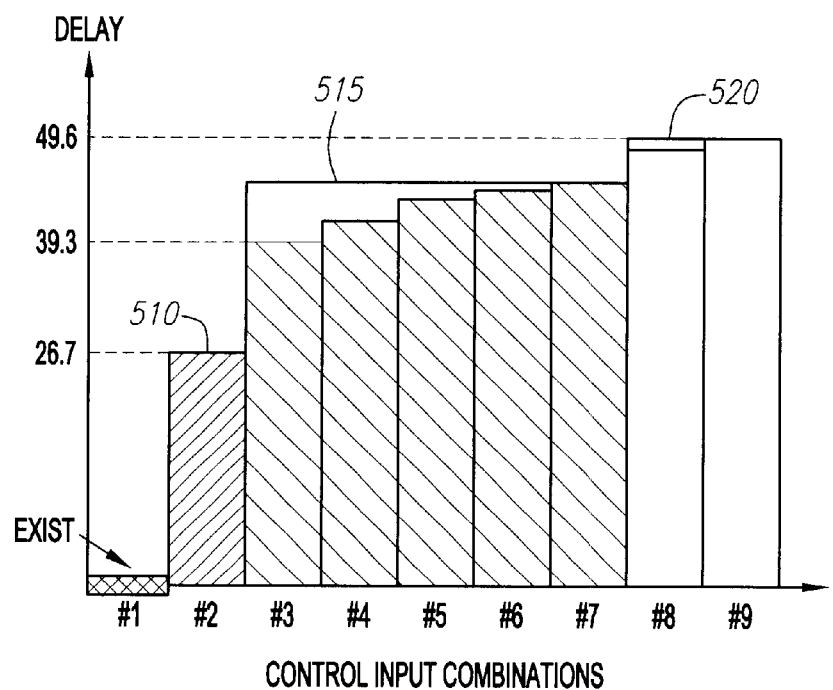
FIG. 5B is a bar graph of the delays of FIG. 5A after grouping or merging delays of similar size according to a user-specified tolerance reduction.

It is possible to reduce the number of delay tables using the table merging algorithm described herein with reference to FIG. 7. By appropriately setting the tolerance TOL, a different amount of reduction is achieved. For example, the tolerance TOL may first be set to 1 nanosecond, which is about 2% of the maximum delay. The application of the table merging algorithm set forth in FIG. 7 reduces the number of conditional delay tables to five. Next, the tolerance TOL may be increased to 5 nanoseconds (about 10% of the maximum delay. The number of tables in such a case is reduced to three by application of the table merging algorithm of FIG. 7. The result is illustrated in FIG. 5B, which graphically illustrates a first group delay time (26.7 ns) for one of the nine input combinations (represented by rectangle 510), a second group delay time for five of the nine input combinations (represented by rectangle 515), and a third group delay time (49.6 ns) for the last two of the nine input combinations (represented by rectangle 520). As the tables are merged their conditions are logically OR'ed, so the new conditions are (C3||C4||C5||C6||C7) for the combined set of control input combinations #3, #4, #5, #5, #7, and (C8||C9) for the combined set of control input combinations #8, #9.

With a tolerance value (TOL) selected to be 25 ns (i.e., 50% of the maximum delay), a single table is obtained. In this example it turns out that all the entries in delay table T9 are greater than their counterparts in delay tables T2–T8. Thus, the final delay table derived by the table merging algorithm of FIG. 7 is identical to delay table T9, with a condition of (C2||C3||. . . C9).

The various examples thus far given are in respect to circuits comprising primarily combinational logic, without latches or memory. The principles and techniques described herein are, however, applicable to analyses in which clocked components, such as latches or memory elements, are utilized. The timing delay analysis described above with respect to FIG. 6 may, for example, utilize an output of a latch, flip-flop or other memory element as one of the set of control inputs, with the timing delay analysis otherwise being the same. Similarly, the timing delay analysis may designate as a data output an input to a latch, flip-flop or other memory element, with the timing delay analysis otherwise being the same. Thus, the timing delay analysis is not limited to the primary inputs or primary outputs of a virtual circuit block or circuit model.

Clock characterization, also referred to as timing abstraction, is a particular type of known analysis to which similar principles and techniques described herein may be applied. Particular clock characterization techniques are described, for example, in S. V. Venkatesh et al, Timing Abstraction for Intellectual Property Blocks, *Proceedings of the Custom Integrated Circuits Conference* (1997), as well as in U.S. patent application Ser. No. 09/215,633 filed Dec. 17, 1998, assigned to the assignee of the present invention, both of which documents are hereby incorporated by reference as if set forth fully herein.

Figure 8A:
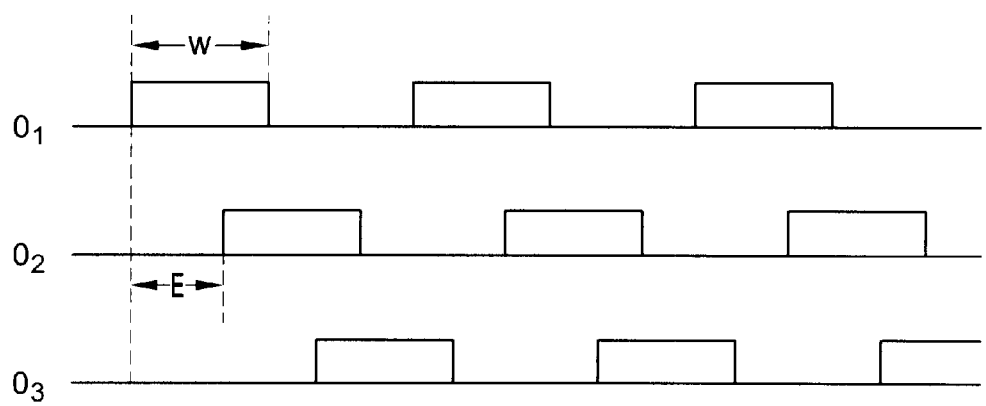
FIG. 8A is a diagram showing a clock having multiple phases.
Figure 8B:
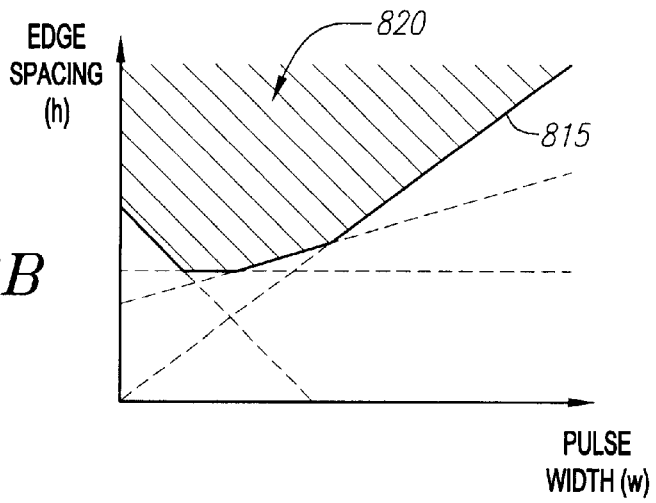
FIG. 8B is a diagram illustrating a feasible region of clocking according to a conventional clock characterization technique.

Clock characterization techniques recognize that clocks generally must be run within a certain range of frequencies in order for a circuit to function properly, and captures these constraints on the clock(s) in a graphical fashion. If a clock is "regular" (that is, each clock phase has an identical waveform shape), then the clock can be completely specified by two parameters (i.e., phase width and phase offset), designated "W" and "E", respectively, in FIG. 8A. Using conventional clock characterization techniques, the space of feasible clocking may be represented as a polytope 815 bounded by half-planes, as illustrated in FIG. 8B. The region 820 of feasible clocking (represented by the shaded portion in FIG. 8B) is based upon delays internal to the circuit model; that is, the clocking can only be as fast as the switching of the internal components will permit.

Clock characterization in one aspect involves the reduction of the large set of timing constraints that govern the operation of a circuit block to a much smaller but equivalent set of clock-edge spacing requirements. This reduction is accomplished by repeated substitution of signal departure times into arrival time equations and signal arrival times into departure time equations, until all departure time variables are eliminated. Arrival time variables are subsequently eliminated by substitution into the setup and hold inequalities, yielding the desired "abstract" timing macromodel. Additional reduction of the constraints can be achieved by imposing some restrictions on the clock system, such as in the case of uniform or regular clocking. Examples of clock characterization, and further details pertaining thereto, are described in the Venkatesh et al paper and U.S. patent application Ser. No. 09/215,633 referred to above.

Figure 8C:
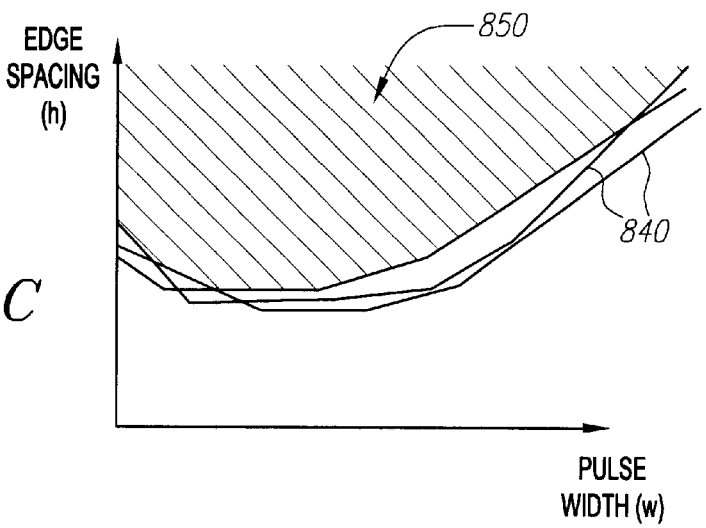
FIG. 8C is a diagram illustrating a feasible region of clocking according to an improved clock characterization technique as disclosed herein.

Conventional clock characterization techniques result in a "worst case" polytope. Using principles described herein, however, a more realistic region of feasible clocking may be determined. According to an improved clock characterization methodology as described herein, a circuit model is used in which data inputs and control inputs are separately identified by the user. The user further specifies meaningful control input combinations, as described before with respect to timing delay analysis. For each control input combination, the control input values are propagated through, and the resulting blocked paths, if any, may be identified through logic simulation. Conventional clock characterization is then carried out, with consideration being given to the blocked paths. Clock characterization is repeated for each control input combination, resulting in a set of polytopes 840, as illustrated in FIG. 8C. The region 850 of feasible clocking (represented by the shaded portion in FIG. 8C) is given by the intersection of the polytopes 840. As a result, a more accurate clock characterization is achieved.

Through the application of the control input combinations, various false paths are eliminated, resulting in a reduction of pessimism and, therefore, more clocking possibilities. It may therefore be noted that, as a result, the polytopes 840 in FIG. 8C are generally wider than the polytope 815 of FIG. 8B, indicating the allowance of more feasible clocking attributes. Even the intersection of polytopes 840 in FIG. 8C (i.e., feasibility region 850) is generally larger than feasibility region 820 in FIG. 8B, again due to the reduction of pessimism in the analysis of clock characterization.

While the information from the various polytopes 840 may be combined to yield a more accurate feasibility region 850, each individual polytope 840 itself is associated with a particular condition (i.e., combination of control inputs), and therefore contains useful information in its own right.

While the invention is susceptible to various modifications and alternative forms, specific examples thereof have been shown by way of example in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed is:

1. A method of analyzing timing in a circuit model, said circuit model including a plurality of inputs and one or more outputs, said plurality of inputs divided into a set of one or more data inputs and a set of one or more control inputs, said method comprising the steps of:

(a) identifying a set of modes, each of said modes corresponding to a unique combination of control input values for the circuit model;

(b) applying the combination of control input values for one of said modes to the circuit model;

(c) for each data input, calculating a maximum delay for each input/output path not passing through a blocked circuit node for the applied combination of control input values;

(d) recording the maximum delay for each input/output path not passing through a blocked circuit node for the applied combination of control input values; and (e) repeating steps (b) through (d) for each of the remaining combinations of control inputs within the set of control inputs.

2. The method of claim 1, further comprising the step of calculating a maximum control input delay over a path from each control input in said set of control inputs to said one or more outputs.

3. The method of claim 1, wherein step (c) comprises the step of calculating a maximum delay for each input/output path for each of a plurality of input slews and output load capacitances, and wherein step (d) comprises the step of recording in a delay table the maximum delay for each input/output path for each of said plurality of input slews and output load capacitances.

4. The method of claim 3, wherein a plurality of delay tables are generated by recording the maximum delay for each input/output path for each of said plurality of input slews and output load capacitances, said method further comprising the step of merging at least two of said delay tables to form a new delay table.

5. The method of claim 4, wherein said step of merging at least two of said delay tables to form said new delay table comprises the steps of ordering said delay tables in ascending or descending order based upon an aggregate sum of delay values in each delay table, evaluating the nearness of said delay tables to one another based upon a specified tolerance, and merging two adjacent delay tables if each element of a first one of said two adjacent delay tables is within said specified tolerance of an element of a second one of said two adjacent delay tables in a same relative position.

6. A method of analyzing timing in a circuit model, said circuit model including a plurality of inputs, one or more outputs, and a plurality of input/output paths between said plurality of inputs and said one or more outputs, said method comprising the steps of:

(a) dividing a plurality of inputs for the circuit model into a set of one or more data inputs and a set of one or more control inputs;

(b) identifying a set of modes, each of said modes corresponding to a unique combination of control input values for the circuit model;

(c) applying the combination of control input values for one of said modes to the circuit model;

(d) for each data input, calculating a maximum delay for each input/output path not passing through a blocked circuit node for the applied combination of control input values;

(e) recording the maximum delay for each input/output path not passing through a blocked circuit node for the applied combination of control input values; and (f) repeating steps (c) through (e) for each of the remaining combinations of control inputs within the set of control inputs.

7. The method of claim 6, further comprising the step of calculating a maximum control input delay over a path from each control input in said set of control inputs to said one or more outputs.

8. The method of claim 6, wherein step (e) comprises the step of calculating a maximum delay for each input/output path for each of a plurality of input slews and output load capacitances, and wherein step (e) comprises the step of recording in a delay table the maximum delay for each input/output path for each of said plurality of input slews and output load capacitances.

9. A computer readable medium having stored therein one or more sequences of instructions for analyzing timing in a circuit model, said circuit model including a plurality of inputs, one or more outputs, and a plurality of input/output paths between said plurality of inputs and said one or more outputs, said one or more sequences of instructions causing one or more processors to perform a plurality of acts, said acts comprising:

(a) receiving a circuit model;

(b) receiving a set of modes each corresponding to a unique combination of control input values for the circuit model;

(c) applying the combination of control input values for one of said modes to the circuit model;

(d) for each data input, calculating a maximum delay for each input/output path not passing through a blocked circuit node for the applied combination of control input values;

(e) recording, in a data structure, the maximum delay for each input/output path not passing through a blocked circuit node for the applied combination of control input values; and (f) repeating steps (c) through (d) for each of the remaining combinations of control inputs within the set of control inputs.

10. The computer readable medium of claim 9, wherein said acts further comprise calculating a maximum control input delay over a path from each control input in said set of control inputs to said one or more outputs.

11. The computer readable medium of claim 9, wherein the act of calculating said maximum delay for each input/output path not passing through a blocked circuit node for the applied combination of control input values includes the act of calculating a maximum delay for each input/output path for each of a plurality of input slews and output load capacitances, and wherein the act of recording, in said data structure, the maximum delay for each input/output path not passing through a blocked circuit node for the applied combination of control input values includes the act of recording in a delay table the maximum delay for each input/output path for each of said plurality of input slews and output load capacitances.

12. The computer readable medium of claim 9, wherein the act of calculating said maximum delay for each input/output path not passing through a blocked circuit node for the applied combination of control input values is carried out using a logic simulator.

\* \* \* \* \*

UNITED STATES PATENT AND TRADEMARK OFFICE
CERTIFICATE OF CORRECTION

PATENT NO.    : 6,457,159 B1
DATED         : September 24, 2002
INVENTOR(S)   : Hakan Yalcin et al.

It is certified that error appears in the above-identified patent and that said Letters Patent is hereby corrected as shown below:

<u>Title page,</u>
Item [75], Inventors, please replace "Robert J. Palmero" with -- Robert J. Palermo --.

Signed and Sealed this

Eleventh Day of November, 2003

JAMES E. ROGAN
*Director of the United States Patent and Trademark Office*